United States Patent
Lindstedt et al.

(10) Patent No.: US 7,330,387 B2
(45) Date of Patent: Feb. 12, 2008

(54) INTEGRATED SEMICONDUCTOR MEMORY DEVICE

(75) Inventors: Reidar Lindstedt, Ottobrunn (DE); Dirk Fuhrmann, Apex, NC (US)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 11/267,572

(22) Filed: Nov. 7, 2005

(65) Prior Publication Data

US 2006/0109727 A1    May 25, 2006

(30) Foreign Application Priority Data

Nov. 5, 2004    (DE)  .................. 10 2004 053 486

(51) Int. Cl.
*G11C 7/00* (2006.01)
*G11C 8/00* (2006.01)
(52) U.S. Cl. ................ 365/205; 365/207; 365/208; 365/189.12; 365/226
(58) Field of Classification Search ............... 365/205, 365/207, 208, 226, 189.05; 327/51, 57, 143
See application file for complete search history.

(56) References Cited

U.S. PATENT DOCUMENTS

| | | | | |
|---|---|---|---|---|
| 4,169,233 A | * | 9/1979 | Haraszti | ............... 327/57 |
| 5,043,944 A | * | 8/1991 | Nakamura et al. | ...... 365/189.05 |
| 5,577,002 A | * | 11/1996 | Takahashi | ............... 365/226 |
| 5,970,007 A | | 10/1999 | Shiratake | |
| 6,198,677 B1 | | 3/2001 | Hsu et al. | |
| 6,407,959 B2 | * | 6/2002 | Ishikawa et al. | ............ 365/226 |
| 6,812,752 B2 | * | 11/2004 | Lin | ............... 327/143 |
| 7,126,870 B2 | * | 10/2006 | Schneider et al. | .......... 365/207 |

\* cited by examiner

*Primary Examiner*—Trong Phan
(74) *Attorney, Agent, or Firm*—Edell, Shapiro & Finnan, LLC

(57) ABSTRACT

An integrated semiconductor memory device includes a sense amplifier that is connected to a first bit line via a first output connection and is connected to a second bit line via a second output connection. A memory cell to store a first or a second memory state is connected to the first bit line. When writing/reading the first memory state, the sense amplifier produces a negative voltage at the first output connection and a positive voltage at the second output connection, and when writing/reading the second memory state, it produces the positive voltage at the first output connection and the negative voltage at the second output connection. The production of a negative voltage results in one of the two bit lines being charged approximately to a ground potential during a read or write access.

10 Claims, 5 Drawing Sheets

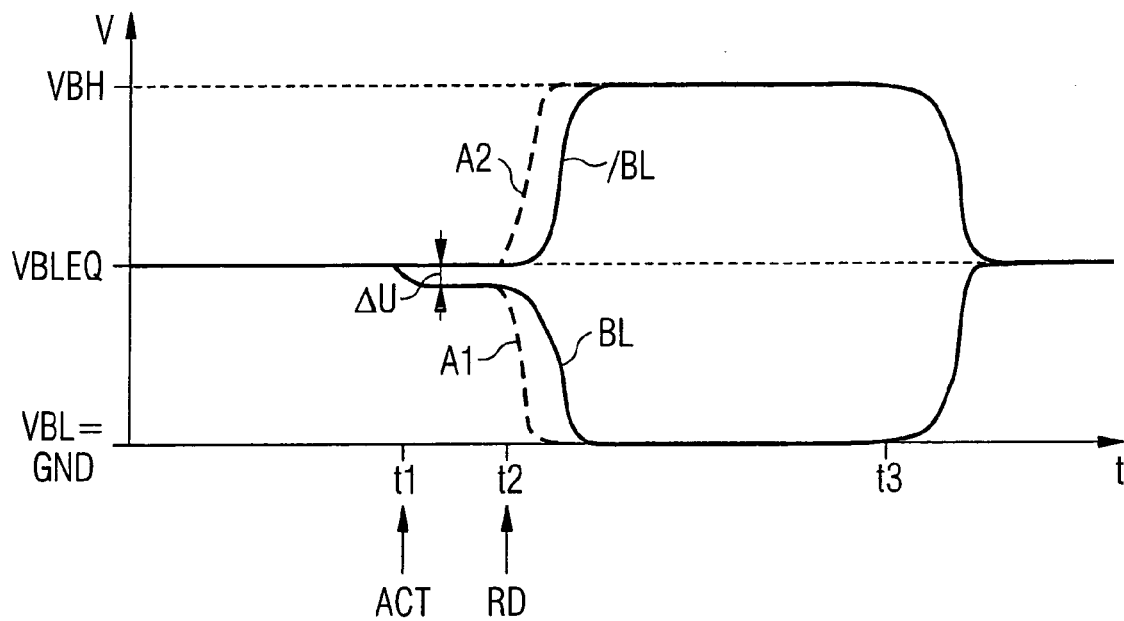
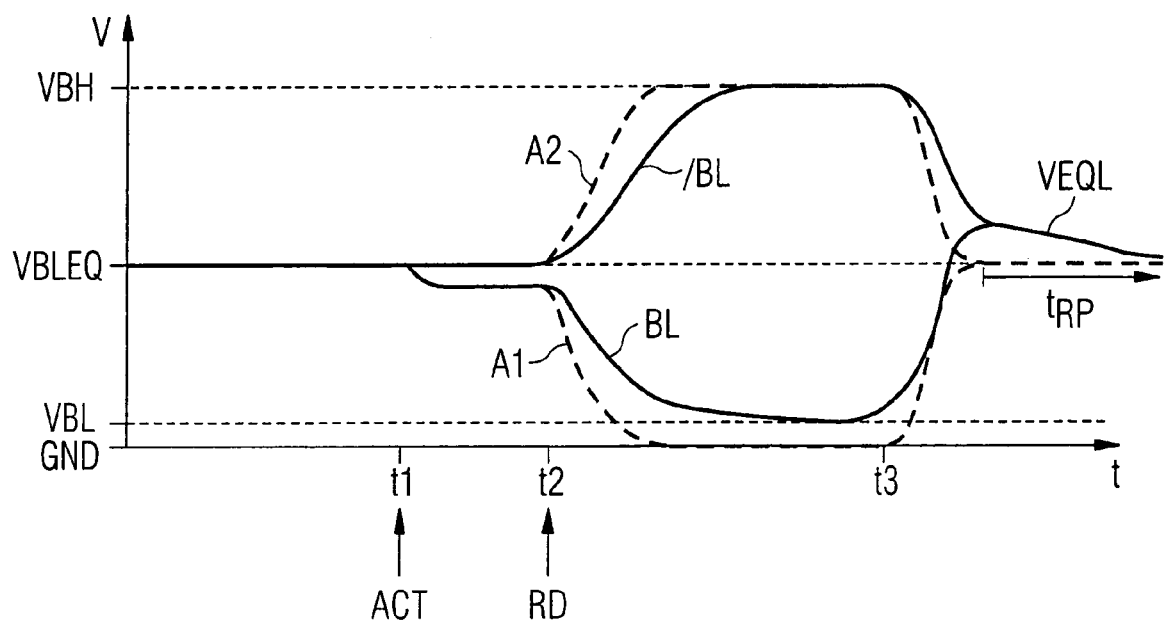

INTEGRATED SEMICONDUCTOR MEMORY DEVICE

CROSS REFERENCE TO RELATED APPLICATIONS

This application claims priority under 35 USC §119 to German Application No. 10 2004 053 486.1, filed, and titled "Integrated Semiconductor Memory," the entire contents of which are hereby incorporated by reference.

FIELD OF THE INVENTION

The invention relates to an integrated semiconductor memory device that includes a sense amplifier connected to a bit line pair in order to amplify a data signal.

BACKGROUND

In the case of integrated semiconductor memories, for example DRAM (Dynamic Random Access Memory) semiconductor memories, information is stored as binary values "0" or "1" in memory cells. FIG. 4 shows an integrated semiconductor memory device 100 with a memory cell array 10, in which bit lines BL and /BL are arranged in pairs. For the sake of simplicity, only one memory cell is illustrated in the memory cell array in FIG. 4, and is in the form of DRAM memory cell SZ. The memory cell SZ has a storage capacitor SC, which can be connected to the bit line BL via a selection transistor AT. A control connection of the selection transistor is connected to a word line WL. In order to control the selection transistor, the control voltages VWL and VWH are applied to a control connection S10a for the word line WL. When driving the control connection S10a with the control voltage VWL, the selection transistor AT is switched off while, in contrast, it is switched on when driving it with the control voltage VWH.

A sense amplifier SA with an output connection A1 and an output connection A2 is also illustrated within the memory cell array. For read and write access to the memory cell SZ, the output connection A1 is connected via a switching transistor 12 to the bit line BL, and the output connection A2 is connected via a switching transistor 13 to the bit line /BL. When writing a data item to the memory cell, the data item to be written is applied to an external data connection DQ, and is supplied to the sense amplifier SA for amplification. When reading a data item from the memory cell, the sense amplifier amplifies the data item that has been read, and passes it to the data connection DQ.

The sense amplifier produces the voltage VBL at its output connection A1 when the binary memory state "0" is being written or read, and produces the voltage VBH at its output connection A1 when the binary memory state "1" is being written or read. The level of the voltage VBH is in this case above the level of the voltage VBL. The voltage VBL normally corresponds to a ground potential GND, to which the control connection S1 is connected. The voltage VBH is supplied to the sense amplifier SA via a control connection S2.

During a precharging process, the two bit lines are charged to a common equalization voltage VBLEQ. For this purpose, the two switching transistors 12 and 13 are switched off by a corresponding level of a control voltage IS which is applied to a control connection S10c. A switching transistor 11 is switched on by a corresponding signal level of a control voltage EQ which is applied to a control connection S10b. The bit lines BL and /BL are thus connected with a low impedance via the switching transistor 11, so that, after a certain amount of time, the charge equalization process between the bit line BL and the bit line /BL results in the equalization voltage VBLEQ being produced on them. Ideally, the equalization voltage corresponds to half the voltage VBH, when VBL corresponds to ground potential GND.

The integrated semiconductor memory device has a supply connection VA for application of a supply voltage VDD. The supply voltage of VDD is supplied to the input side of a voltage stabilization circuit 30, which produces a stabilized internal voltage Vint on its output side. The stabilized internal voltage Vint is supplied to an input connection E40 of a voltage generator 40, which uses the stabilized internal voltage Vint to produce the control voltages VBH, IS, EQ, VWL and VWH on its output side.

The integrated semiconductor memory device furthermore has a control circuit 20 with a control connection S20. Read, write and precharging processes for the memory cell array 10 can be controlled via the control circuit 20 by application of control signals to the control connection S20. Depending on whether a read, write or precharging process is taking place, the control circuit 20 feeds the levels (produced by the voltage generator 40) of the control voltages VBH, IS, EQ, VWL and VWH to the control connections S10a, S10b, S10c, S1 and S2 of the memory cell array 10.

FIG. 5 shows potential states at the output connections A1 and A2 of the sense amplifier SA and on the connected bit lines BL and /BL. Before the time t1, the two bit lines are conductively connected via the switching transistor 11, and are charged to the equalization voltage VBLEQ. In this state, the word line is at the potential VWL, which switches off the selection transistor AT. A level of the control signal IS which reliably switches off the switching transistors 12 and 13 is applied to the control connection S10c, so that the sense amplifier SA is isolated from the bit line pair.

The control circuit 20 is driven by an activation signal ACT at the time t1. If it is assumed that an address AS which is associated with the memory cell SZ is applied to an address connection A90, then the switching transistor 11 is switched off, and the word line WL is driven with the control voltage VWH. This causes the selection transistor AT to be switched on, so that the storage capacitor SC is connected with a low impedance to the bit line BL. This results in a small potential change, the so-called signal shift ΔU, on the bit line BL with respect to the complementary bit line /BL. In the example shown in FIG. 5, the binary memory state "0" is stored in the memory cell SZ. The storage capacitor SC is charged to the voltage VBL, which corresponds to ground potential GND. In this case, switching on the selection transistor results in a potential reduction on the bit line BL in comparison to the equalization voltage VBLEQ.

The control connection S20 is driven by a read signal RD at the time t2. The switching transistors 12 and 13 are then switched on, so that the sense amplifier SA is connected via the output connection A1 to the bit line BL, and via the output connection A2 to the bit line /BL. The sense amplifier detects the potential difference ΔU between the bit line BL and the complementary bit line /BL, and produces ground potential VBL at the output connection A1, and the voltage VBH at the output connection A2. The level of the voltage VBH in this case corresponds to a voltage level which is used for storage of a logic high level in the memory cell. The bit lines BL and /BL assume the potential state VBL=GND and VBH with respect to the output connections, by virtue of the bit line capacitances and the RC constants associated with them. Since the selection transistor AT is still switched on, the binary memory state "0" is written back to the memory cells SZ. The state "0" is emitted in a corresponding manner at the data connection DQ.

The read access is terminated at the time t3. The selection transistor AT is switched off again by the control voltage VWL on the word line WL, as are the switching transistors 12 and 13, so that the sense amplifier SA is isolated from the connected bit line pair BL and /BL. During the course of a precharging process, the two bit lines are connected to one another with a low impedance via the switching transistor 11, and are charged to the equalization voltage VBLEQ. This reproduces the original state for a subsequent read or write access.

If, as is illustrated in FIG. 5, the memory state "0" was stored in the memory cell SZ, a signal shift results after the selection transistor has been switched on, and this is slightly below the equalization voltage VBLEQ. If, in contrast, the memory state "1" was stored in the memory cell SZ, then this results in a signal shift ΔU, which is slightly above the equalization voltage VBLEQ. In order that the sense amplifier SA can detect the minor potential reduction and the minor voltage increase with equal sensitivity, the two bit lines BL and /BL are ideally charged after the precharging phase to a level of the equalization voltage VBLEQ which is precisely halfway between the high level VBH and the low level VBL. When the level of the voltage VBL corresponds to ground potential GND, the level of the equalization voltage is thus ideally VBLEQ=VBH/2.

However, it has been found that the potential profiles at the output connections A1 and A2 of the sense amplifier and on the bit lines BL and /BL do not match the idealized profiles shown in FIG. 5 in reality. FIG. 6 shows potential profiles at the output connections A1 and A2 and on the bit line pair BL and /BL when using a real sense amplifier which is connected to a real bit line pair. After application of the read signal RD to the control connection S20 at the time t2, the output connections A1 and A2 assume the potential states GND and VBH with a considerably greater time delay than in the case of the ideal sense amplifier shown in FIG. 5, because of the internal RC constant of the sense amplifier. The potential states on the bit lines BL and /BL likewise change considerably more slowly. This response is because of the RC constant of the bit line by which the bit line capacitance is charged. In process terms, additional RC constants can delay the reaching of one or both voltage level VBL or VBH. FIG. 6 illustrates the situation in which there is an additional RC constant which results in the high voltage potential VBH being reached on one of the two bit lines, but the other of the two bit lines is not drawn completely to ground potential.

In general, a residual charge remaining on the bit line BL is caused by the reading phase between the times t2 and t3 being chosen to be too short, or else frequently by leakage paths as well, by which an additional charge is fed to the bit line BL. Leakage paths such as these can in general be caused by adjacent bit lines, or else by adjacent lines in other metal layers. Furthermore, the spreading of the bit lines, that is to say the charging of the bit line pair to the voltages VBH and VBL=GND is interfered with by capacitive coupling effects from adjacent bit lines and by parasitic transistors, via which interference currents are likewise fed to the bit lines to be spread.

After completion of the read access at the time t3, the inadequately charged bit lines, in particular the inadequately discharged bit line BL, are connected to one another with a low impedance once again via the switching transistor 11, in order to assume a common potential state in the course of the precharging process. Since, in particular, the bit line BL is not at ground potential at the time t3, a dynamic equalization voltage VEQL is formed on the bit line pair and, in the example shown in FIG. 6, is above the ideal equalization voltage VBLEQ. The dynamic equalization voltage VEQL does not assume the level of the ideal equalization voltage VBLEQ=VBH/2 again until after a sufficiently long precharging time interval $t_{RP}$. This is because the two bit lines are not only connected to one another but are additionally also still connected to a voltage generator, which is not illustrated in FIG. 4, for production of the equalization voltage VBLEQ.

However, the incomplete discharging of the bit line BL to the voltage level VBL=GND has a problematic effect when read and write accesses to memory cells which are connected to the bit line pair BL and /BL follow one another at short time intervals. In this case, the precharging phase is too short to charge the bit line pair to the ideal equalization voltage VBLEQ. In the example shown in FIG. 6, when a subsequent read access is then made, the bit line BL is still charged to a level of the dynamic equalization voltage VEQL which is above the equalization voltage VBLEQ. Particularly when reading the binary memory state "0" this can result in the signal shift being so small that, despite the potential reduction, the voltage on the bit line BL is above the equalization voltage VBLEQ. In this situation, the sense amplifier SA detects and amplifies an incorrect memory state.

If, in contrast, the signal shift when reading the binary memory state "0" is, however, still not sufficiently great for a potential state below the equalization voltage VBLEQ to be produced on the bit line, and is thus sufficient for detection and amplification of the correct memory state, then the subsequent spreading of the bit lines nevertheless takes place from a potential level which is lower than the equalization voltage VBLEQ. The voltage level VBL which is reached on the bit line during the subsequent read access will thus be even further above the voltage level which was still reached on the last access, and which in that case was already above the ground potential GND.

SUMMARY OF THE INVENTION

An object of the present invention is to provide an integrated semiconductor memory device in which a sense amplifier produces, during a read and write access, a voltage by which a first and a second bit line of a bit line pair are each charged to a voltage level, so that a data item can be reliably stored in a memory cell in the integrated semiconductor memory device.

Another object of the present invention is to provide a method in which a sense amplifier produces, during a read and write access, a voltage by which a first and a second bit line in a bit line pair are each charged to a voltage level such that a data item can be reliably stored in a memory cell in the integrated semiconductor memory device.

The aforesaid objects are achieved individually and/or in combination, and it is not intended that the present invention be construed as requiring two or more of the objects to be combined unless expressly required by the claims attached hereto.

In accordance with the invention, an integrated semiconductor memory device comprises a first bit line and a second bit line, and at least one memory cell that is connected to the first bit line to store a first memory state or a second memory state. The integrated semiconductor memory device further comprises a sense amplifier with a first output connection and a second output connection, at each of which a negative voltage or a positive voltage can be produced. In order to write a memory state to the memory cell or in order to read a memory state from the memory cell, the first output connection of the sense amplifier can be connected to the first bit line, and the second output connection can be connected to the second bit line. The sense amplifier is configured in such a manner that it produces the negative voltage at the first output connection and produces the positive voltage at the second output connection when writing the first memory state to the memory cell or when reading the first memory state from the memory cell, for a time period during which the first output connection of the sense amplifier is connected to the first bit line and the second output connection of the sense amplifier is connected to the second bit line. Furthermore, the sense amplifier is configured in such a manner that it produces the positive voltage at the first output connection and produces the negative voltage at the second output connection when writing the second memory state to the memory cell or when reading the second memory state from the memory cell, for the time period during which the first output connection of the sense amplifier is connected to the first bit line and the second output connection of the sense amplifier is connected to the second bit line.

In general, during a read or write access to a memory cell, a sense amplifier produces a ground potential at one of its two output connections in order to charge that bit line which is connected to the output connection at which ground potential is produced to ground potential. If the read time is too short or in the case of a faulty bit line on which leakage currents occur, the bit line reaches a low potential, but does not completely reach ground potential. The production of a negative voltage at one of the output connections may, however, result in a faulty bit line such as this being drawn completely to ground potential. During a subsequent low-impedance connection of a bit line pair, this thus also ensures that the equalization voltage corresponds approximately accurately to half the positive voltage to which the other of the bit lines is charged.

The integrated semiconductor memory device can include a first controllable voltage generator to produce the negative voltage and a second controllable voltage generator to produce the positive voltage. The positive voltage and the negative voltage can be supplied to the sense amplifier.

It is thus possible to match both the negative voltage, which is produced by the sense amplifier in order to store the memory state "0" in the memory cell, and the positive voltage, which is produced by the sense amplifier in order to store the memory state "1" in the memory cell. The nominal value of the negative voltage and of the positive voltage can preferably be chosen such that the sense amplifier is just as sensitive for reading the memory state "0" as for reading the memory state "1".

The first voltage generator can include a charge pump in order to produce the negative voltage.

In an embodiment of the integrated semiconductor memory device of the invention, the integrated semiconductor memory device further comprises a control circuit. The sense amplifier includes a first control connection to apply the negative voltage and a second control connection to apply the positive voltage. The negative voltage can be supplied to the first control connection of the sense amplifier via a first controllable switch, and the positive voltage can be supplied to the second control connection of the sense amplifier via a second controllable switch. The control circuit is configured in such a manner that it switches the first controllable switch and the second controllable switch on when writing a memory state to the memory cell or when reading a memory state from the memory cell.

In another embodiment, the integrated semiconductor memory device further comprises a register to store operating parameters for the integrated semiconductor memory device. A nominal value of the negative voltage and a nominal value of the positive voltage can be stored in the register. The control circuit is configured in such a manner that, in a test operating mode of the integrated semiconductor memory device, it reads the nominal value of the negative voltage and the nominal value of the positive voltage from the register for storage of the operating parameters, and drives the first controllable voltage generator in such a manner that the first controllable voltage generator produces the negative voltage on its output side at a level which matches the nominal value of the negative voltage stored in the register for storage of the operating parameters, and in such a manner that it drives the second controllable voltage generator in such a manner that the second controllable voltage generator produces the positive voltage on its output side at the level which matches the nominal value of the positive voltage stored in the register for storage of the operating parameters.

In a further embodiment, the integrated semiconductor memory device comprises a first programming circuit to store the nominal value of the negative voltage and a second programming circuit to store the nominal value of the positive voltage. The control circuit is configured in such a manner that, in a normal operating mode, it reads the nominal value of the negative voltage and the nominal value of the positive voltage from the register that stores the operating parameters and drives the first controllable voltage generator in such a manner that the first controllable voltage generator produces the negative voltage on its output side at a level which matches the nominal value of the negative voltage stored in the first programming circuit, and drives the second controllable voltage generator in such a manner that the second controllable voltage generator produces the positive voltage on its output side at a level which matches the nominal value of the positive voltage stored in the second programming circuit.

In further accordance with the invention, a method for operating an integrated semiconductor memory device comprises providing an integrated semiconductor memory device including a first bit line and a second bit line, at least one memory cell to store a first or a second memory state and that is connected to the first bit line and can be conductively connected to the first bit line in order to read the memory state, a sense amplifier with a first output connection and a second output connection, at each of which a negative voltage and a positive voltage can be produced, in which the first output connection of the sense amplifier can be connected to the first bit line and the second output connection can be connected to the second bit line in order to read a memory state from the memory cell. The first bit line and the second bit line are precharged to an equalization voltage, whose level corresponds to half the level of the positive voltage. The memory cell is then connected to the first bit line in order to read the memory state stored in the memory cell, and this results in a signal shift being produced on the first bit line. The negative voltage is then produced selectively at the first output connection of the sense amplifier, and the positive voltage is then produced selectively at the second output connection of the sense amplifier for a time period during which the first output connection of the sense amplifier is connected to the first bit line and the second output connection of the sense amplifier is connected to the second bit line, when the signal shift produced on the first bit line is below the equalization voltage, or the positive voltage is produced selectively at the first output connection and the negative voltage of the sense amplifier is produced selectively at the second output connection for the time period during which the first output connection of the sense amplifier is connected to the first bit line and the second output connection of the sense amplifier is connected to the second bit line, when the signal shift produced on the first bit line is above the equalization voltage. The first bit line and the second bit line are then precharged to the equalization voltage by connecting the first bit line to the second bit line with a low impedance.

Another method according to the invention comprises providing an integrated semiconductor memory device with a first bit line and with a second bit line, with at least one memory cell for storage of a first or second memory state. The memory cell is connected to the first bit line, and can be conductively connected to the first bit line in order to write the memory state. Furthermore, a sense amplifier including a first output connection and a second output connection is provided, at each of which a negative voltage and a positive voltage can be produced, in which case the first output connection of the sense amplifier can be connected to the first bit line and the second output connection can be connected to the second bit line in order to write a memory state to the memory cell. The first bit line and the second bit line are precharged to an equalization voltage, whose level corresponds to half the level of the positive voltage. The memory cell is then conductively connected to the first bit line in order to write the first or second memory state to the memory cell. The negative voltage is then produced selectively at the first output connection and the positive voltage is produced selectively at the second output connection of the sense amplifier for storage of the first memory state in the memory cell, for a time period during which the first output connection of the sense amplifier is connected to the first bit line and the second output connection of the sense amplifier is connected to the second bit line, or the positive voltage is produced at the first output connection and the negative voltage is produced at the second output connection of the sense amplifier in order to store the second memory state in the memory cell for a time period during which the first output connection of the sense amplifier is connected to the first bit line and the second output connection of the sense amplifier is connected to the second bit line. The first bit line and the second bit line are then precharged to the equalization voltage by connecting the first bit line to the second bit line with a low impedance.

The above and still further objects, features and advantages of the present invention will become apparent upon consideration of the following detailed description of specific embodiments thereof, particularly when taken in conjunction with the accompanying drawings where like numerals designate like components.

BRIEF DESCRIPTION OF THE DRAWINGS

FIG. 5 shows voltage profiles of the output connections of an ideal sense amplifier and on a connected ideal bit line pair.

FIG. 6 shows voltage profiles of the output connections of a real sense amplifier and on a connected real bit line pair for the device of FIG. 4.

DETAILED DESCRIPTION

Figure 1:
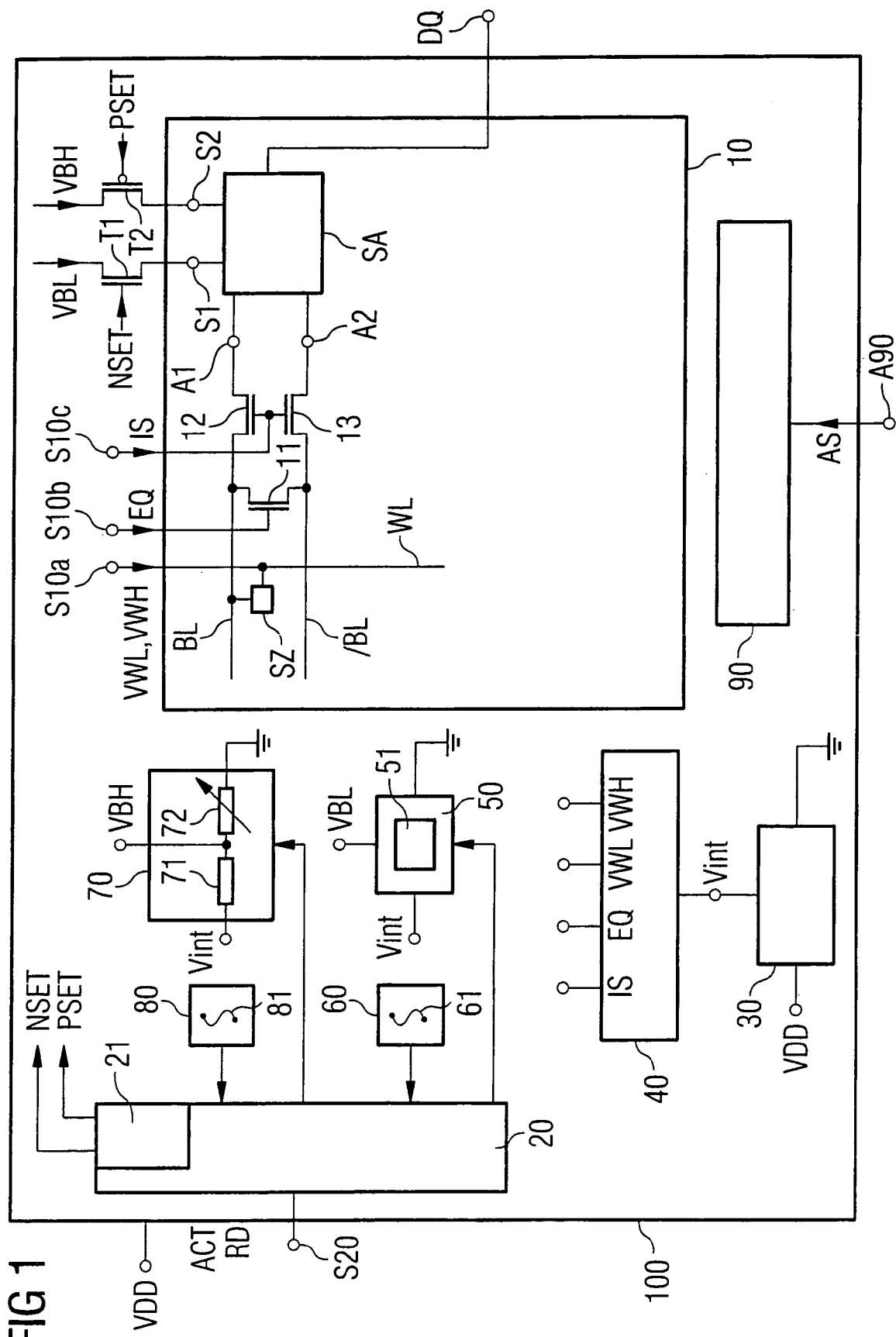
FIG. 1 shows an integrated semiconductor memory device for charging bit lines to a positive and negative voltage potential according to the invention.
Figure 4:
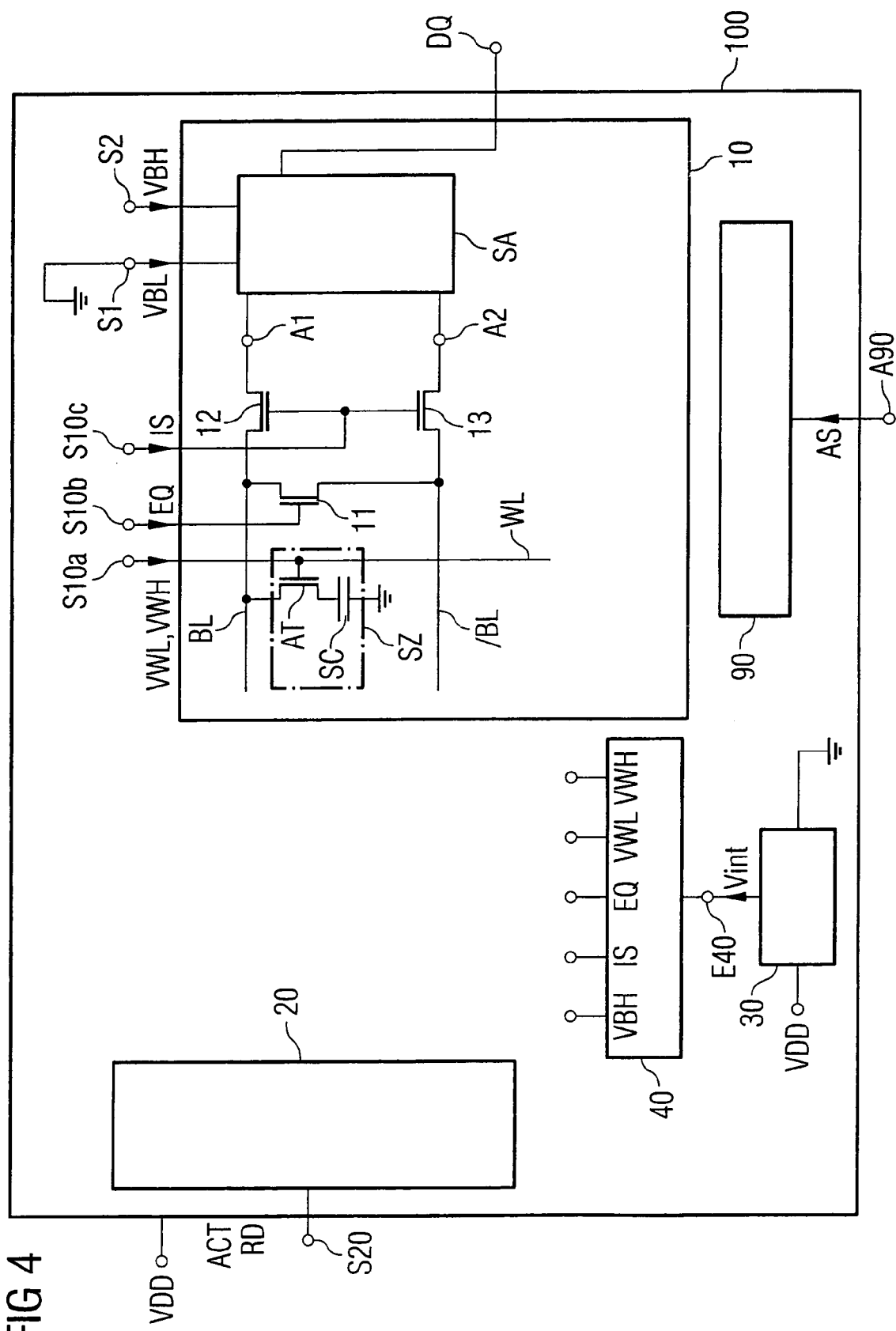
FIG. 4 shows an integrated semiconductor memory device for charging bit lines to voltage potentials according to the prior art.

FIG. 1 shows an integrated semiconductor memory device 100 which contains not only the components illustrated in FIG. 4 but also a first controllable voltage generator 50 to produce a negative voltage VBL, and a second controllable voltage generator 70 to produce a positive voltage VBH. Since the positive voltage VBH is now produced by the controllable voltage generator 70, the voltage generator 40 of FIG. 1 (in contrast to FIG. 4) produces only the control voltage IS for driving the switching transistors 12 and 13, the control voltage EQ for switching the transistor 11 on or off, and the two word line voltages VWL and VWH.

The controllable voltage generator 50 includes a connection to apply the internal supply voltage Vint which, as already explained in FIG. 4, is derived from a voltage stabilization circuit 30 from an externally applied supply voltage VDD. The controllable voltage generator 50 also includes a charge pump 51, which produces a negative voltage VBL from the positive internal voltage Vint.

The controllable voltage generator 70 likewise includes a connection to apply the internal supply voltage Vint. It also includes a voltage divider including a resistor 71 and a controllable resistor 72. A positive voltage VWH can be produced on the output side by variation of the controllable resistor 72. The two controllable voltage generators 50 and 70 produce the levels of their output voltages as a function of a drive by the control circuit 20.

The control circuit 20 includes a register 21 to store operating parameters for the integrated semiconductor memory device. A nominal value of the positive voltage VBH and a nominal value of the negative voltage VBL can be stored within this register which, for example, may be in the form of the mode register or the extended mode register of a semiconductor memory.

The integrated semiconductor memory device also includes a programming circuit 60 with programmable elements 61, and a programming circuit 80 with programmable elements 81. The programmable elements may, for example, be in the form of fuse elements. The fuse elements 61 can be programmed in order to store the nominal value of the negative voltage VBL within the programming circuit 60. The fuse elements 81 can be programmed in order to store the nominal value of the positive voltage VBH within the programming circuit 80.

In contrast to FIG. 4, FIG. 1 shows one embodiment in which the sense amplifier SA is not supplied with the voltages VBL and VBH directly, but via switching transistors T1 and T2. The switching transistor T1 is in the form of an n-channel field-effect transistor, which is controlled by a control signal NSET that is produced by the control circuit 20. The switching transistor T2 is in the form of a p-channel field-effect transistor, which is driven by a control signal PSET, that is likewise produced by the control circuit 20.

Figure 2:
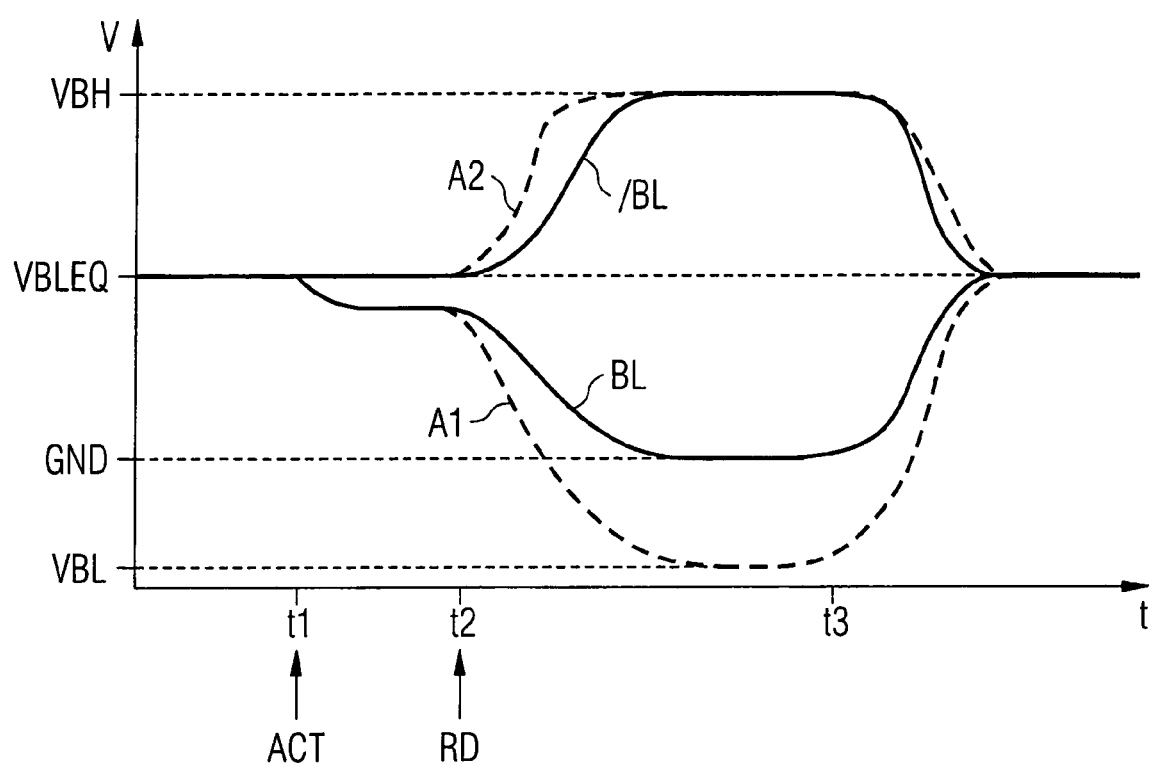
FIG. 2 shows voltage profiles of the output connections of a sense amplifier and on a connected bit line pair of the semiconductor memory device of FIG. 1 according to the invention.

In contrast to the integrated semiconductor memory device shown in FIG. 4, the voltage potentials VBH and VBL are, according to the invention, variable. In this context, FIG. 2 shows potential profiles at the output connections A1 and A2 of the sense amplifier and on the connected bit lines BL and /BL. In contrast to FIG. 6, the sense amplifier SA feeds the voltage VBL to the bit line BL at its output connection A1, with a negative level being produced by the controllable voltage generator 50 and its charge pump 51. The negative voltage VBL counteracts the interference currents described above. In consequence, the bit line BL can be charged to ground potential after the read access at the time t2. Since the bit line /BL is charged to the full level of the voltage VBH, the bit line pair assumes the equalization voltage VBLEQ a short time after the initiation of the precharging phase at the time t3, and this equalization voltage VBLEQ is thus approximately accurately half of the two voltage levels VBH and GND. It is particularly worthwhile to reduce the nominal value of the voltage VBL when reading memory cells in which the memory state "0" has been stored.

If parasitic currents are also fed to the complementary bit line /BL, it is also worthwhile varying the voltage VBH. The controllable voltage generator 70 is driven appropriately by the control circuit 20 for this purpose, so that the value of the resistor 72 changes. The change in the voltage level of the voltage VBH has been found to be particularly advantageous, as well, when a memory cell in which the memory state "1" is stored is being read. In this case, charge is dissipated via leakage paths to adjacent bit lines, so that the potential state on the bit line BL no longer completely reaches this voltage level despite the output connection A1 being driven with the full voltage level VBH by the sense amplifier. In this case, the controllable voltage generator 70 produces a higher level of the voltage VBH at the output connection A1, so that the voltage potential VBH is produced approximately, once again, despite the charge being dissipated on the bit line BL. The increased level of the voltage VBH is in this case above a voltage level which identifies a logic high level.

The FIGS. 3A, 3B, 3C and 3D show the number of cells that have been tested to be "good", in which the memory state "1" is stored a first time, and the memory state "0" is stored a second time. As explained, the reading of the memory state "0" can be improved by variation of the voltage VBL while, in contrast, the reading of memory cells in which the memory state "1" is stored can be improved by varying the voltage VBH. The FIGS. 3A, 3B, 3C and 3D in each case describe the memory cells of a semiconductor memory and the memory cells of all the memory chips located on a wafer with the memory state "1". The memory cells are then read once again, with different levels being produced for the voltage VBH. The number of cells in which the memory state "1" can be successfully read is determined as a function of the discrepancy between the voltage level ΔVBH that is produced and the initial value of the voltage VBH. The memory state "0" is then written to the memory cells in a semiconductor memory, or to all the memory cells on a wafer. The memory state "0" is then read for different voltage levels VBL. The number of cells in which the memory state "0" can be successfully read is plotted as a function of the discrepancy between the voltage level ΔVBL that is produced and the initial value of the voltage VBL.

Figure 3A:
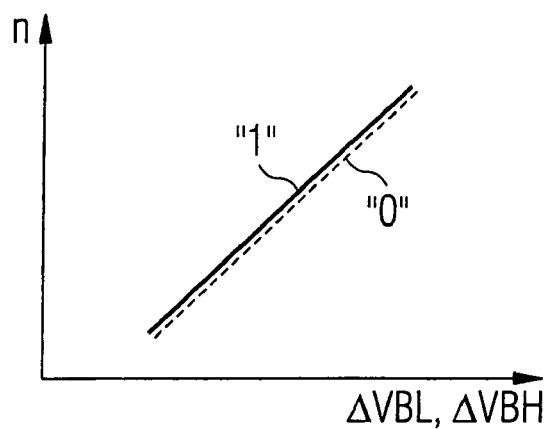
FIGS. 3A, 3B, 3C, 3D show the number of memory cells measured to be "good" (pass cells) when a change occurs in the voltage potentials produced by a sense amplifier according to the invention.

FIG. 3A shows the situation in which the sense amplifiers for the memory chip have a neutral behavior with respect to the amplification of the memory state "1" and the memory state "0". This means that, when the discrepancy between the voltages ΔVBH and ΔVBL and the respective initial value of the voltages increases, the sense amplifiers will detect the memory state "0" and the memory state "1" with equal frequency. The sense amplifiers thus behave with equal sensitivity with respect to the memory state to be detected.

Figure 3B:
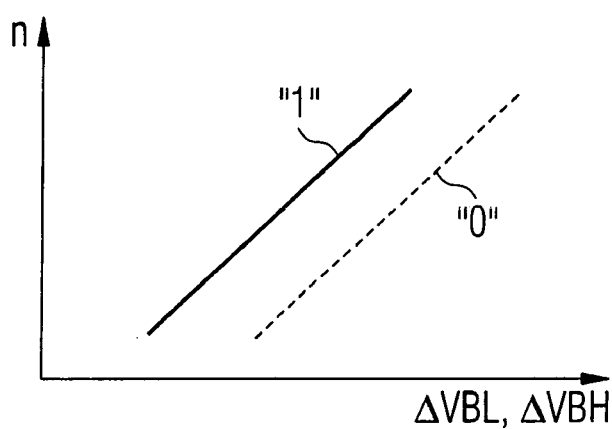

FIG. 3B shows the situation in which the memory state "1" can be read successfully more frequently than the memory state "0" when the discrepancy between the voltages ΔVBH and ΔVBL and the initial value of the voltages VBH and VBL is the same even though the memory state "1" and the memory state "0" have been written to precisely the same number of memory cells. The sense amplifiers for memory chips on a wafer or memory cells in a single semiconductor memory in this case have different sensitivity for the reading of a binary "1" and a binary "0".

Figure 3C:
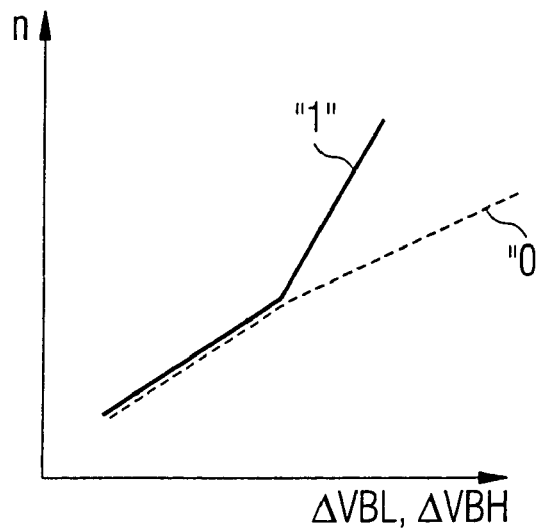
Figure 3D:
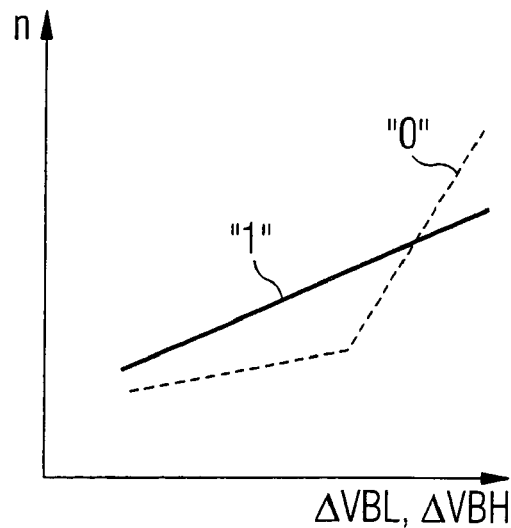

FIGS. 3C and 3D show the situation in which the sense amplifiers of memory chips on a wafer or the sense amplifiers of a single semiconductor memory successfully amplify one of the two binary memory states considerably more frequently when there is more than a specific discrepancy between the voltage ΔVBH and ΔVBL and an initial value VBH and VBL, even though the number of the two memory states that are actually stored is the same.

By variation of the voltage levels VBH and VBL, it is thus possible to analyze whether the reading of the memory state "1" or the reading of the memory state "0" is more critical within a memory cell array in an integrated semiconductor memory device or on the memory chips of a wafer. The nominal value of the voltages VBH and VBL is preferably selected such that the number of successfully read memory cells in which the binary "1" and the binary "0" are stored is the same and is as great as possible. The sense amplifiers then behave with equal sensitivity for the reading of the binary "1" and the reading of the binary "0".

The nominal values of the voltages VBL and VBH determined in this way can be stored for test purposes in the register 21 which, for example, is a mode register or an extended mode register.

After completion of all the tests, the nominal values of the voltages VBH and VBL are permanently programmed in the programming circuit 60 and 80. The control circuit 20 reads these values during subsequent normal operation of the integrated semiconductor memory device, and drives the controllable voltage generators 50 and 70 in such a way that they produce the predetermined nominal values of the voltages VBH and VBL.

In order to determine during the production of the semiconductor memories whether the determined nominal values of the voltages VBH and VBL can still be used or whether they must be redefined, a read access is made with a different equalization voltage VBLEQ in a functional test of the semiconductor memory. The voltage level in one memory cell is artificially reduced by slightly raising or lowering the equalization voltage VBLEQ.

The memory cells in a semiconductor memory or all of the memory cells in memory chips on a wafer have the binary memory state "0" written to them during a so-called "signal margin zero test". The memory contents are then read, with the precharging time $t_{RE}$ initially being set to be long, for example $t_{RP}$=8 μs, and subsequently very short, for example $t_{RP}$=10 ns. If considerably more cells fail in the second case than in the first case, this can be assessed as indicating that the voltage VBL must be redefined again, as described with reference to FIGS. 3A-3D.

The binary memory state "1" is written to the memory cells in a memory module or to all the memory cells on a wafer during a "signal margin one test". As described for the "signal margin zero test", the stored memory contents are then read, with the precharging phase lasting for longer in the first case than in the second case. If considerably more memory cells fail during the short precharging phase than during the long precharging phase, it is recommended that the voltage VBH be reset again.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
|---|---|
| 10 | Memory cell array |
| 11, 12, 13 | Switching transistors |
| 20 | Control circuit |
| 21 | Register for storage of operating parameters |
| 30 | Voltage stabilization circuit |
| 40 | Voltage generator |
| 50 | Voltage generator for production of VBL |
| 51 | Charge pump |
| 60 | Programming circuit for the nominal value of VBL |
| 61 | Fuse element |
| 70 | Voltage generator for production of VBL |
| 71 | Resistor |
| 72 | Controllable resistor |
| 80 | Programming circuit for the nominal value of VBH |
| 81 | Fuse element |
| 90 | Address register |
| A | Output connection |
| ACT | Activation signal |
| AT | Selection transistor |
| IS, EQ | Control voltages |
| NSET, PSET | Control signals |
| RD | Read signal |
| S | Control connection |
| SA | Sense amplifier |
| SC | Storage capacitor |
| SZ | Memory cell |
| T1, T2 | Switching transistors |
| VBH, VBL | Bit line high/bit line low voltage |
| VDD | Supply voltage |
| Vint | Interval voltage |
| VWL, VWH | Word line high/word line low voltage |

What is claimed is:

1. An integrated semiconductor memory device comprising:
a first bit line and a second bit line;
at least one memory cell that is connected to the first bit line to store a first memory state or a second memory state;
a first controllable voltage generator to produce a negative voltage;
a second controllable voltage generator to produce a positive voltage;
a sense amplifier including a first output connection and a second output connection, wherein the sense amplifier is configured to receive the negative voltage from the first controllable voltage generator via a first controllable switch and to receive the positive voltage from the second controllable voltage generator via a second controllable switch, and the sense amplifier is further configured to produce the negative voltage or the positive voltage at the first output connection and the second output connection;
a control circuit configured to switch the first and second controllable switches on when writing a memory state to the memory cell or when reading a memory state from the memory cell; and
a register configured to store operating parameters for the memory device including a nominal value of the negative voltage and a nominal value of the positive voltage;
wherein:
the first output connection of the sense amplifier is connectable to the first bit line and the second output connection is connectable to the second bit line in order to write a memory state to the memory cell or to read a memory state from the memory cell;
the sense amplifier is further configured such that the sense amplifier produces the negative voltage at the first output connection and the sense amplifier produces the positive voltage at the second output connection, when writing the first memory state to the memory cell or when reading the first memory state from the memory cell, for a time period during which the first output connection of the sense amplifier is connected to the first bit line and the second output connection of the sense amplifier is connected to the second bit line;
the sense amplifier is further configured such that the sense amplifier produces the positive voltage at the first output connection and the sense amplifier produces the negative voltage at the second output connection when writing the second memory state to the memory cell or when reading the second memory state from the memory cell, for the time period during which the first output connection of the sense amplifier is connected to the first bit line and the second output connection of the sense amplifier is connected to the second bit line; and
the control circuit is further configured such that, in a test operating mode of the integrated semiconductor memory device, the control circuit reads the nominal value of the negative voltage and the nominal value of the positive voltage from the register that stores operating parameters, and the control circuit drives the first controllable voltage such that the first controllable voltage generator produces the negative voltage on an output side of the first controllable voltage generator at a level which matches the nominal value of the negative voltage stored in the register that stores the operating parameters, and the control circuit drives the second controllable voltage generator such that the second controllable voltage generator produces the positive voltage on an output side of the second controllable voltage generator at a level which matches the nominal value of the positive voltage stored in the register that stores the operating parameters.

2. The integrated semiconductor memory device of claim 1, wherein:
an internal stabilized voltage is supplied to each of the first controllable voltage generator and the second controllable voltage generator;
wherein the first controllable voltage generator is configured such that the first controllable voltage generator produces the negative voltage from the internal stabilized voltage, and the second controllable voltage generator is configured such that the second controllable voltage generator produces the positive voltage from the internal stabilized voltage.

3. The integrated semiconductor memory device of claim 1, wherein the first controllable voltage generator includes a charge pump to produce the negative voltage.

4. The integrated semiconductor memory device of claim 1, wherein the second controllable voltage generator includes a voltage divider with a controllable resistor to produce the positive voltage.

5. The integrated semiconductor memory device of claim 1, further comprising:
a first programming circuit to store the nominal value of the negative voltage;
a second programming circuit to store the nominal value of the positive voltage;
wherein the control circuit is configured such that, in the normal operating mode, the control circuit reads the nominal value of the negative voltage and the nominal value of the positive voltage from the register that stores the operating parameters and drives the first controllable voltage generator such that the first controllable voltage generator produces the negative voltage on the output side of the first controllable voltage generator at a level which matches the nominal value of the negative voltage stored in the first programming circuit, and the control circuit drives the second controllable voltage generator such that the second controllable voltage generator produces the positive voltage on the output side of the second controllable voltage generator at a level which matches the nominal value of the positive voltage stored in the second programming circuit.

6. The integrated semiconductor memory device of claim 5, wherein the first programming circuit and the second programming circuit include fuse elements.

7. A method for operating an integrated semiconductor memory device, comprising:
providing an integrated semiconductor memory device including a control circuit including a register, a first controllable voltage generator to produce a negative voltage, a second controllable voltage generator to produce a positive voltage, a first bit line and a second bit line, at least one memory cell to store a first memory state or a second memory state and being conductively connected to the first bit line to read the memory state, a sense amplifier to receive the negative and positive voltages from the first and second controllable voltage generators and including a first output connection and a second output connection at which the negative and positive voltages are produced, wherein the first output connection of the sense amplifier is connectable to the first bit line and the second output connection of the sense amplifier is connectable to the second bit line in order to read a memory state from the memory cell;
precharging the first bit line and the second bit line to an equalization voltage at a level that corresponds to half the level of the positive voltage;
conductively connecting the memory cell to the first bit line to read the memory state stored in the memory cell and to produce a signal shift on the first bit line;
performing one of:
producing the negative voltage at the first output connection of the sense amplifier and producing the positive voltage at the second output connection of the sense amplifier for a time period during which the first output connection of the sense amplifier is connected to the first bit line and the second output connection of the sense amplifier is connected to the second bit line and when the signal shift produced on the first bit line is less than the equalization voltage; and
producing the positive voltage at the first output connection of the sense amplifier and producing the negative voltage at the second output connection of the sense amplifier for the time period during which the first output connection of the sense amplifier is connected to the first bit line and the second output connection of the sense amplifier is connected to the second bit line and when the signal shift produced on the first bit line is above the equalization voltage;
precharging the first bit line and the second bit line to the equalization voltage by the low-impedance connection of the first bit line to the second bit line;
storing a nominal value of the negative voltage and a nominal value of the positive voltage in the register;
evaluating the register with the control circuit;
driving the first controllable voltage generator by the control circuit in a test operating mode of the integrated semiconductor memory device such that the first controllable voltage generator produces the negative voltage on an output side of the first controllable voltage generator at the level which is stored as the nominal value of the negative voltage in the register; and
driving the second controllable voltage generator by the control circuit in a test operating mode of the integrated semiconductor memory device such that the second controllable voltage generator produces the positive voltage on an output side of the second controllable voltage generator at the level which is stored as the nominal value of the positive voltage in the register.

8. The method of claim 7, further comprising:
providing the integrated semiconductor memory device with a first programming circuit to store the nominal value of the negative voltage and with a second programming circuit to store the nominal value of the positive voltage;
storing the nominal value of the negative voltage in the first programming circuit;
storing the nominal value of the positive voltage in the second programming circuit;
evaluating the nominal values of the negative voltage stored in the first programming circuit and of the positive voltage stored in the second programming circuit with the control circuit;
driving the first controllable voltage generator with the control circuit in a normal operating mode of the integrated semiconductor memory device such that the first controllable voltage generator produces the negative voltage on the output side of the first controllable voltage generator at the level that is stored as the nominal value of the negative voltage in the first programming circuit; and
driving the second controllable voltage generator with the control circuit in the normal operating mode of the integrated semiconductor memory device such that the second controllable voltage generator produces the positive voltage on the output side of the second controllable voltage generator at the level that is stored as the nominal value of the positive voltage in the second programming circuit.

9. A method for operation of an integrated semiconductor memory device, comprising:

providing an integrated semiconductor memory device including a control circuit including a register, a first controllable voltage generator to produce a negative voltage, a second controllable voltage generator to produce a positive voltage, a first bit line and a second bit line, at least one memory cell to store a first memory state or a second memory state and being conductively connected to the first bit line to write the memory state, a sense amplifier to receive the negative and positive voltages from the first and second controllable voltage generators and including a first output connection and a second output connection at which the negative and positive voltages are produced, wherein the first output connection of the sense amplifier is connectable to the first bit line and the second output connection of the sense amplifier is connectable to the second bit line to write a memory state to the memory cell;

precharging the first bit line and the second bit line to an equalization voltage at a level that corresponds to half the level of the positive voltage;

conductively connecting the memory cell to the first bit line to write the first memory state or the second memory state to the memory cell;

performing one of:
  producing the negative voltage at the first output connection of the sense amplifier and producing the positive voltage at the second output connection of the sense amplifier to store the first memory state in the memory cell for a time period during which the first output connection of the sense amplifier is connected to the first bit line and the second output connection of the sense amplifier is connected to the second bit line; and
  producing the positive voltage at the first output connection of the sense amplifier and producing the negative voltage at the second output connection of the sense amplifier to store the second memory state in the memory cell for the time period during which the first output connection of the sense amplifier is connected to the first bit line and the second output connection of the sense amplifier is connected to the second bit line;

precharging the first bit line and the second bit line to the equalization voltage by the low-impedance connection of the first bit line to the second bit line;

storing the nominal value of the negative voltage and the nominal value of the positive voltage in the register;

storing a nominal value of the negative voltage and a nominal value of the positive voltage in the register;

evaluating the register with the control circuit;

driving the first controllable voltage generator by the control circuit in a test operating mode of the integrated semiconductor memory device such that the first controllable voltage generator produces the negative voltage on an output side of the first controllable voltage generator at the level which is stored as the nominal value of the negative voltage in the register; and driving the second controllable voltage generator by the control circuit in a test operating mode of the integrated semiconductor memory device such that the second controllable voltage generator produces the positive voltage on an output side of the second controllable voltage generator at the level which is stored as the nominal value of the positive voltage in the register.

10. The method of claim 9, further comprising:

providing the integrated semiconductor memory device with a first programming circuit to store the nominal value of the negative voltage and with a second programming circuit to store the nominal value of the positive voltage;

storing the nominal value of the negative voltage in the first programming circuit;

storing the nominal value of the positive voltage in the second programming circuit;

evaluating the nominal values of the negative voltage stored in the first programming circuit and of the positive voltage stored in the second programming circuit with the control circuit;

driving the first controllable voltage generator with the control circuit in a normal operating mode of the integrated semiconductor memory device such that the first controllable voltage generator produces the negative voltage on the output side of the first controllable voltage generator at the level that is stored as the nominal value of the negative voltage in the first programming circuit; and driving the second controllable voltage generator with the control circuit in the normal operating mode of the integrated semiconductor memory device such that the second controllable voltage generator produces the positive voltage on the output side of the second controllable voltage generator at the level that is stored as the nominal value of the positive voltage in the second programming circuit.

* * * * *